United States Patent [19]
Chan et al.

[11] Patent Number: 5,122,852
[45] Date of Patent: Jun. 16, 1992

[54] GRAFTED-CRYSTAL-FILM INTEGRATED OPTICS AND OPTOELECTRONIC DEVICES

[75] Inventors: Winston K. Chan, Fair Haven; Alfredo Yi-Yan, Eatontown, both of N.J.

[73] Assignee: Bell Communications Research, Inc., Livingston, N.J.

[21] Appl. No.: 514,914

[22] Filed: Apr. 23, 1990

[51] Int. Cl.$^5$ .............................. H01L 27/14
[52] U.S. Cl. ........................ 357/30; 357/19; 357/60; 357/16; 156/662; 156/654; 437/126; 385/15; 385/130
[58] Field of Search ............ 357/30 E, 19, 60, 16, 357/30 D; 350/96.11, 96.12, 96.14, 96.15, 96.17, 96.19; 156/633, 655, 654, 662; 437/126, 914, 974

[56] References Cited

U.S. PATENT DOCUMENTS

| | | | |
|---|---|---|---|
| 4,835,575 | 5/1989 | Plihal | 357/19 X |
| 4,846,931 | 7/1989 | Gmitter et al. | 756/633 |
| 4,883,561 | 11/1989 | Gmitter et al. | 156/633 |

OTHER PUBLICATIONS

Yablonovitch et al, "Double Heterostructure GaAs/AlGaAs Thin Film Diode Lasers on Glass Substrates," *IEEE Photonics Technology Letters*, vol. 1, No. 2, Feb. '89, 41–42.
Yablonovitch et al, "Extremes Selectivity in The Lift-Off of Epitaxial GaAs Films," *Appl. Phys. Lett.* 51(26), Dec. 28, 1987, pp. 2222–2224.
Yablonovitch et al, "Regrowth of GaAs Quantum Wells on GaAs Liftoff Films 'van der Waals Bonded' to Silicon Substrates," *Electronics Letters* Jan. 19, 1989, vol. 25, No. 2, pp. 171–172.
Howard, "Structure for Optical Coupling to Thin-Semiconductor Layers," *IBM Technical Disclosure Bulletin*, vol. 14, No. 12, May, 1972, 3787–88.
Miura et al, "Optoelectronic Integrated AlGaAs/GaAs p-i-n/Field-Effect Transistor with an Embedded, Planar p-i-n Photodiode," *Appl. Phys. Lett.* 48(21), May 26, 1986, pp. 1461–1462.
Tracy et al, "Gratings for Integrated Optics by Electron Lithography," *Applied Optics*, Jul. 1974, vol. 13, No. 7, pp. 1695–1702.

*Primary Examiner*—William Mintel
*Attorney, Agent, or Firm*—Leonard Charles Suchyta; Charles S. Guenzer

[57] ABSTRACT

Integrated devices, comprising an optical waveguide in a substrate, are made by attaching a crystal film to the substrate. Such films can be made by an epitaxial lift-off technique which involves epitaxial growth on an auxiliary substrate, release of a grown single- or multi-layer film from the auxiliary substrate, and transfer of the released film to its intended location where lithographic patterning can be used for the production of devices accurately positioned relative to waveguides. Electrical contacts to devices can take the form of metallic layers which further can serve to secure film edges to the substrate.

22 Claims, 6 Drawing Sheets

GRAFTED-CRYSTAL-FILM INTEGRATED OPTICS AND OPTOELECTRONIC DEVICES

FIELD OF THE INVENTION

The invention is concerned with integrated optics and optoelectronic devices, and methods of fabrication of such devices.

BACKGROUND OF THE INVENTION

In the fabrication of integrated devices, diverse materials are of interest, e.g., glasses, semiconductors, and electro-optic, magneto-optic, and acousto-optic crystals. Materials are chosen on the basis of desired optical and/or electrical properties, e.g., low insertion loss, high electro- or magneto-optical coefficient, and suitable bandgap, and with cost and ease of fabrication in mind. For example, silica-based glasses and lithium niobate crystals are suitable for the fabrication of inexpensive waveguides having low insertion loss, lithium niobate further having high electro-optic coefficients, and thus allowing highly efficacious modulation of the phase, polarization, and amplitude of guided light. Semiconductors offer the opportunity to vary the concentration of highly mobile carriers through doping and "band-gap engineering", allowing the fabrication of waveguides, sources, detectors, and high-speed electronics.

For optical sources such as light-emitting diodes and lasers, for photodetectors, and for optical amplifiers, Group III-V compound semiconductors have become materials of choice—to be combined, e.g., with glass waveguides in opto-electronic integrated circuits (OEIC's). Integration poses difficulties, however, in that customary methods of integrated device fabrication do not allow growth of single-crystal compound-semiconductor layers on substrates having random or incompatible surface structure. As a result, progress towards the commercialization of integrated optics has been impeded, recourse seeming necessary to the exclusive use of sub-optimal, crystallographically compatible materials, or else to the inclusion of discrete devices delicately aligned with substrate-supported waveguides ("flip-chip" technique).

Relevant with respect to the invention described below is the recent development of a so-called epitaxial lift-off technique, involving epitaxial growth of a film of a desired material on a first, auxiliary or growth substrate, followed by detaching and removal of the grown film for attachment or grafting onto a second, desired substrate. Processing of this type has received attention, e.g., as an alternative to lattice-mismatched epitaxial growth of gallium arsenide on silicon; specifically, as disclosed by E. Yablonovitch et al., "Extreme Selectivity in the Lift-off of Epitaxial GaAs Films", Applied Physics Letters 51 (1987), pp. 2222-2224, a gallium arsenide film can be grown on an intermediate aluminum arsenide layer on a gallium arsenide substrate, and the grown gallium arsenide film can be lifted off upon undercut etching—i.e., upon chemical dissolution of the intermediate layer. For further details and preferred embodiments of epitaxial lift-off processing see U.S. Pat. Nos. 4,846,931 and 4,883,561, issued to T. J. Gmitter et al. on Jul. 11, 1989 and Nov. 28, 1989, respectively; for exemplary uses of resulting films as bonded to desired substrates see, e.g., E. Yablonovitch et al., "Regrowth of GaAs Quantum Wells on GaAs Liftoff Films 'Van der Waals Bonded' to Silicon Substrates", Electronics Letters, Vol. 25 (1989), p. 171; and E. Yablonovitch et al., "Double Heterostructure GaAs/AlGaAs Thin Film Diode Lasers on Glass Substrates", IEEE Photonics Technology Letters, Vol. 1 (1989), pp. 41-42.

SUMMARY OF THE INVENTION

Grafting a homogeneous or heterogeneous crystal film onto a substrate, in optical coupling relationship with a waveguide in the substrate, allows the fabrication of optimized integrated devices with photolithographic accuracy, and without need for alignment of discrete components. Conveniently, films suitable for grafting are produced by epitaxial lift-off after growth on an auxiliary substrate, and grafted films may be pattern-etched by lithographic methods.

When used, e.g., as optical detectors or as light sources, grafted films can be electrically contacted by metallization layers which further serve to fasten film edges to the substrate—such a fastening effect being of use also with nonmetallic materials, and with other, nonoptical devices.

DETAILED DESCRIPTION

In the Figures, like elements are designated by the same numeral. In the following, physical dimensions and performance data are understood to be nominal or approximate.

Figure 1:
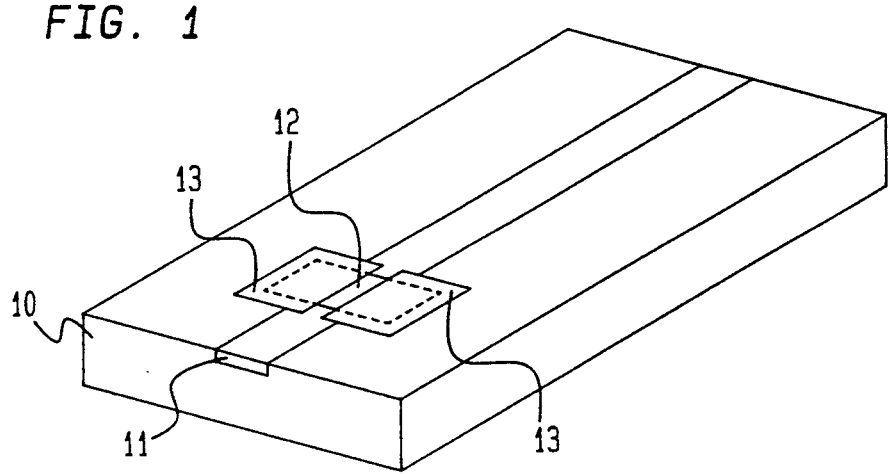
FIG. 1 is an enlarged schematic perspective view of an integrated metal-semiconductor-metal optical detector device in accordance with a preferred embodiment of the invention.

FIG. 1 shows substrate 10, waveguide 11, detector film 12, and Schottky metal contacts 13. Exemplary materials and dimensions are as follows: Soda lime glass for substrate 10, with potassium-ion exchanged waveguide 11 having a width of 7 micrometers; (undoped) gallium arsenide detector film 12 having a thickness of 250 nanometers, a width of 13 micrometers, and a length of 75 micrometers, and being centered on waveguide 11; contacts 13 consisting of a first, 10-nanometer layer of titanium, and a second, 250-nanometer layer of gold, and the two contacts being separated by a 2.5-micrometer gap. As a benefit of contacts formed across an edge of film 12 as shown, such contacts can serve to enhance adhesion of film 12 by fastening or "tacking down" its edge. This benefit is independent of optical aspects of the invention and can be realized also in the attachment of other devices, e.g., metal-semiconductor field-effect transistors.

Contact geometries other than as depicted in FIG. 1 are not precluded; e.g., instead of being separated laterally with respect to the waveguide, contacts may be spaced apart longitudinally, in the direction of light propagation. Other device variants include a planar waveguide instead of a stripe waveguide, and other suitable materials may be used. Of particular interest in this respect are electro-optic substrate materials, e.g., lithium niobate, with a proton-exchanged or titanium-indiffused waveguide stripe or layer, for example. Also of interest are grafted semiconductor films on semiconductor substrates, e.g., an aluminum-gallium arsenide film on an indium phosphide substrate, or vice versa.

Figure 2:
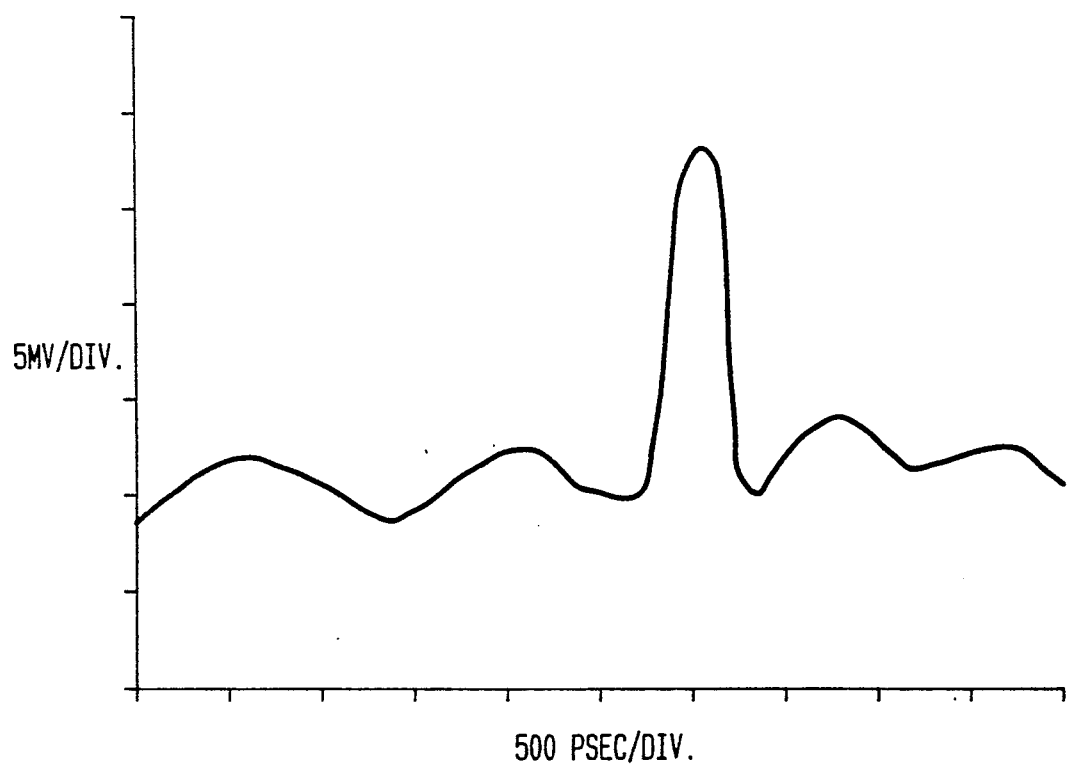
FIG. 2 is a graph of voltage as a function of time, illustrating the response of a device in accordance with FIG. 1.
Figure 3A:
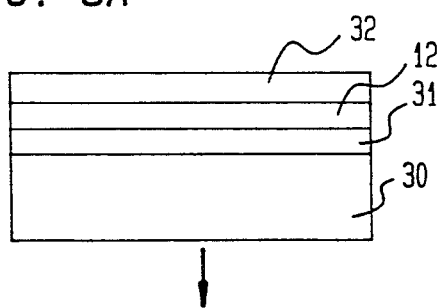
FIGS. 3A-3G illustrate a process of making a structure in accordance with FIG. 1, being enlarged schematic elevations of preliminary, intermediate, and final structures.
Figure 3C:
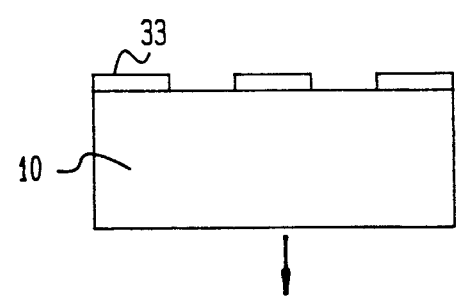
Figure 3B:
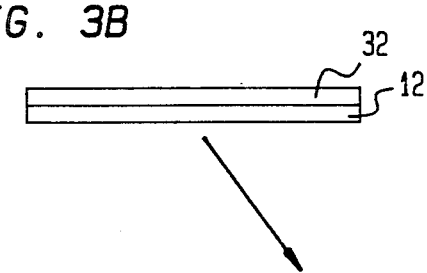
Figure 3D:
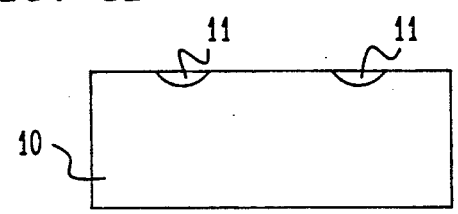
Figure 3E:
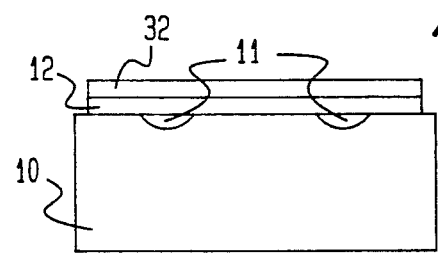
Figure 3F:
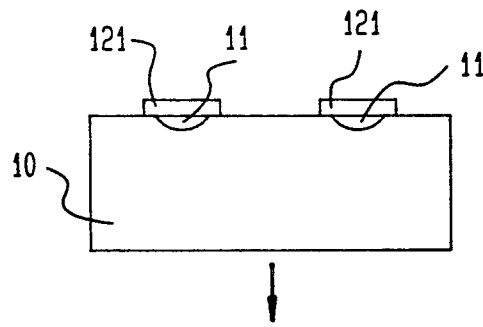
Figure 3G:
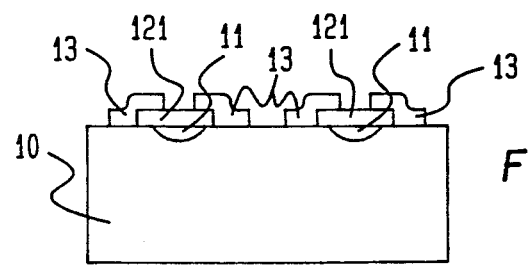

FIG. 2 illustrates experimentally determined high-speed response of a representative device in accordance with FIG. 1. A bias voltage of 5 volts was applied between contacts 13, and TM-polarized light from a 100-femtosecond pulsed dye laser at a wavelength of 0.6 micrometer was launched into waveguide 11 by means of a microscope objective lens. Shown, as a function of time, is the voltage response between contacts 13—indicating a bandwidth of approximately 1 gigahertz.

FIG. 3, (a) and (b) illustrate preferred epitaxial growth of film 12 on release layer 31 on auxiliary substrate 30, and epitaxial lift-off of film 12 with support layer 32. Exemplary materials are gallium arsenide for substrate 30, aluminum arsenide for release layer 31, and paraffinic-asphaltene for support layer 32; preferred epitaxial lift-off processing is described in further detail in the above-identified patents by T. J. Gmitter et al. and papers by E. Yablonovitch et al. Typically, the size of film 12 as removed from its growth substrate considerably exceeds desired device size; indeed, as illustrated in the following, an epitaxial lift-off film preferably may be large enough to encompass a plurality of spaced-apart devices FIG. 3, (c) and (d) illustrate processing in the fabrication of waveguides 11 in a suitable substrate 10, waveguides 11 being formed, e.g., by localized ion exchange in the presence of a suitable mask 33. Such a mask may have been made by evaporation of a layer of aluminum having a thickness of 100 nanometers, followed by photolithographic patterning. More specifically, in the case of a soda-lime-glass substrate, a waveguide may be formed by potassium-ion exchange, e.g., in a melt of potassium nitrate, for 5 hours, at a temperature of 375 degrees C. Then, the aluminum mask may be stripped in phosphoric acid, and deionized water may be used for rinsing.

FIG. 3, (e) shows the supported film 12 of FIG. 3, (b) attached to the waveguide structure of FIG. 3, (d) whose crystallographic surface structure typically is unlike that of the film being attached or grafted; attachment may be by Van der Waals surface forces, without use of an additional adhesive layer.

FIG. 3, (f) shows the structure of FIG. 3, (e) after stripping of support layer 32, e.g., in trichloroethylene, and photolithographic tailoring of the attached film—resulting in film segments 121, individually centered on waveguides 11. Thus, in contradistinction to "flip-chip" hybrid assemblies, preferred devices of the invention are positioned and aligned with photolithographic accuracy.

FIG. 3, (g) shows the structure of FIG. 3, (f) after further formation of contacts 13, e.g., by evaporation and photolithographic patterning, or by (conventional) lift-off processing.

Figure 4:
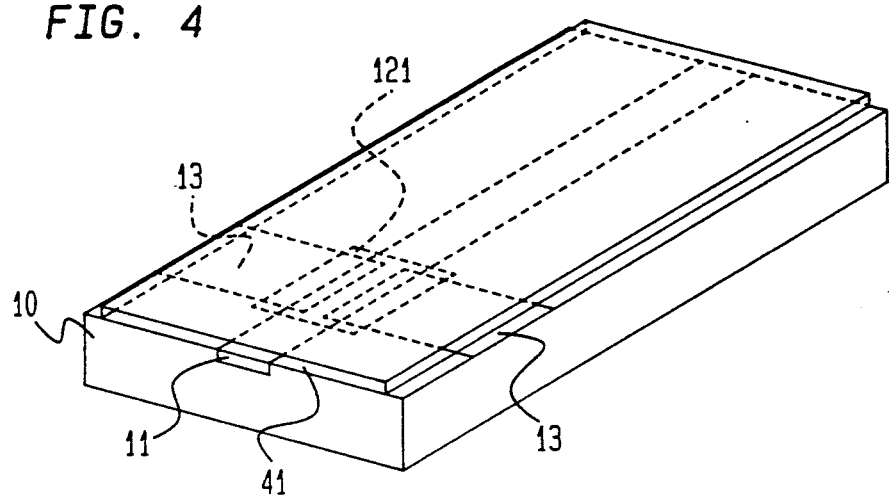
FIG. 4 is an enlarged schematic perspective view of an integrated optical device in accordance with a preferred further embodiment of the invention.
Figure 5:
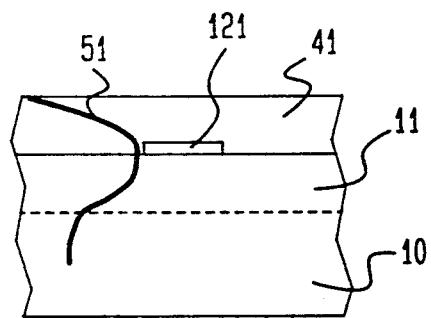
FIG. 5 is a schematic representation of optical power distribution in a device in accordance with FIG. 4.

In addition to features in accordance with FIG. 1, FIG. 4 shows large-area, transparent dielectric layer 41 which may consist, e.g., of deposited aluminum oxide, of a spin-on glass, or of a polymeric material. In this configuration, optical power is transmitted in the combined feature formed by waveguide 11 and a portion of dielectric layer 41 overlying waveguide 11; thus, by appropriate choice of material and thickness, it is possible to arrange for a desired point of the optical power profile to coincide with the location of a grafted film 12. For example, as illustrated by FIG. 5, this point may correspond to the peak of optical power profile 51. Such an arrangement is beneficial not only for devices operating as detectors, but also, e.g., for modulators and lasers. Moreover, layer 41 can further serve as an encapsulant, providing for environmental protection of the underlying structure.

Figure 6:
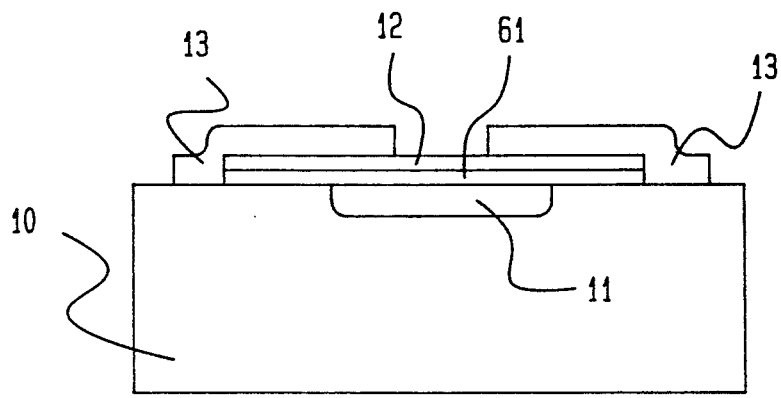
FIG. 6 is an enlarged schematic cross section of a preferred further embodiment of an integrated optical device in accordance with the invention.

In addition to features in accordance with FIG. 1, FIG. 6 shows a layer 61 intermediate to film 12 and waveguide 11. Such a layer may serve for (wavelength-dependent) enhancement or impedance of optical interaction between waveguide 11 and film 12, and may take the form of a heterostructure in which sublayers of high and low refractive index alternate. This may be realized, for example, by interleaved sublayers of first and second aluminum-gallium arsenide materials which differ in aluminum/gallium concentration. Layer 61 may also serve to compensate for effects due to the unintentional presence of impurities, e.g., air, water, or native oxide between the waveguide and the grafted layer; for example, in the case of a lithium niobate substrate 10 with an ion-exchanged waveguide 11 and a gallium arsenide grafted film 12, it was found beneficial in this respect to include a layer 61 consisting of evaporated silicon, 50 nanometers thick.

Combination of a top layer in accordance with FIG. 4 and an intermediate layer in accordance with FIG. 6 is not precluded.

Figure 7:
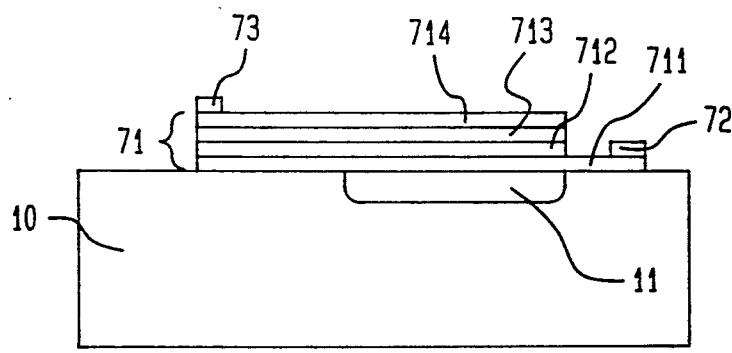
FIG. 7 is an enlarged schematic cross section of a p-i-n optical detector, integrated in accordance with a preferred further embodiment of the invention.

FIG. 7 shows substrate 10, waveguide 11, p-i-n detector structure 71, and contacts 72 and 73. Structure 71 may comprise a 20-nanometer n-plus layer 711 of indium-gallium arsenide, a 150nanometer layer 712 of n-indium phosphide, a 300-nanometer layer 713 of indium-gallium arsenide as doped intrinsically, and a 60-nanometer p-plus layer 714 of indium-gallium arsenide. (Such a structure is suitable for a detector having high sensitivity at wavelengths of interest in fiber optics.)

Exemplary fabrication of this structure is analogous to fabrication in accordance with FIG. 3, except that growth on an auxiliary substrate now involves formation of a heterostructure film comprising a plurality of epitaxial layers. Such a film may be grown on an indium phosphide substrate without a release layer, and freed upon chemical dissolution of the substrate in hydrochloric acid—with indium-gallium arsenide layer 711 serving as an etch stop. (In other cases, in which an indium-gallium arsenide etch-stop layer is present beneath an indium phosphide layer without being intended for inclusion in a desired film, the etch-stop layer may be etched away in turn, e.g., in a suitable mixture of phosphoric acid, hydrogen peroxide, and water, with the indium phosphide layer now serving as an etch stop.) N-type contact 72 may be made by depositing layers of gold, germanium, and nickel, and alloying of the deposit; p-type contact 73 may consist of titanium-gold, alloyed beryllium-gold, or alloyed zinc-gold.

Figure 8:
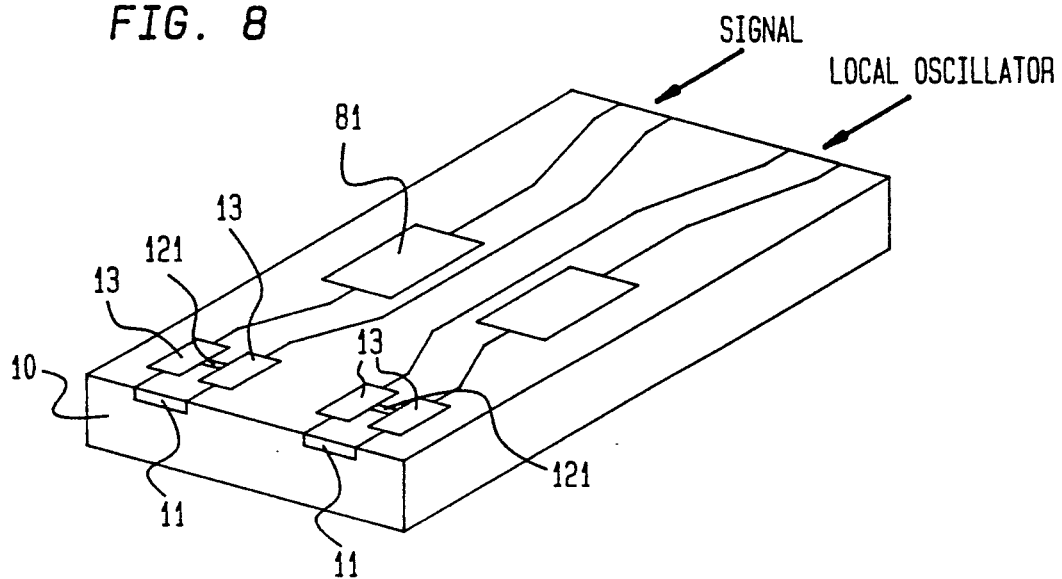
FIG. 8 is an enlarged schematic perspective view of a balanced optical receiver comprising grafted detectors in accordance with a preferred use of the invention.

FIG. 8 shows a 3-dB coupler formed by a pair of waveguides 11 in electro-optical substrate 10, with control electrodes 81 for fine-tuning of coupling. Two detectors are shown as in FIG. 1; alternatively, detectors may be included as shown in FIG. 7, for example. Control electrodes 81 may consist of successively deposited titanium and gold layers. Preferably, prior to metal deposition for control electrodes 81, a thin layer of a dielectric, e.g., silicon dioxide is deposited. Beneficially, other features may be included, e.g., a transparent covering layer as described above in connection with FIG. 4 and 5.

The coupler of FIG. 8 shows two semiconductor detectors formed from a single grafted film, but electrically isolated from each other by etching through the semiconductor film 12 to the insulating substrate 10, forming isolated film segments 121. This aspect of the invention can be used even for nonoptical electronic integrated circuits when subcircuits or individual devices, e.g., field effect transistors or high-electron-mobility transistors, require high electrical isolation. Subcircuits or individual devices can be defined in the film before epitaxial lift-off or, preferably, after grafting. An insulating thin film over a conducting substrate provides the same result. For example, a 200-nanometer layer of silicon nitride was grown on a 3-to-5-ohm-centimeter silicon substrate. A gallium arsenide film was then grafted onto the silicon nitride film, and a 25-micrometer gap was etched through the gallium arsenide. There was less than 1 picoampere of leakage current at 50 volts between the separated gallium arsenide portions. By contrast, in a structure comprising semiconductor layers on the substrate on which they were grown, several nanoamperes of leakage current are present, so that, in accordance with this aspect of the invention, an improvement by a factor of 1000 or more is realized. Also in accordance with this aspect, it was found that voltage applied to one device did not have any measurable effect on a neighboring device (i.e., there was no "sidegating").

Figure 9:
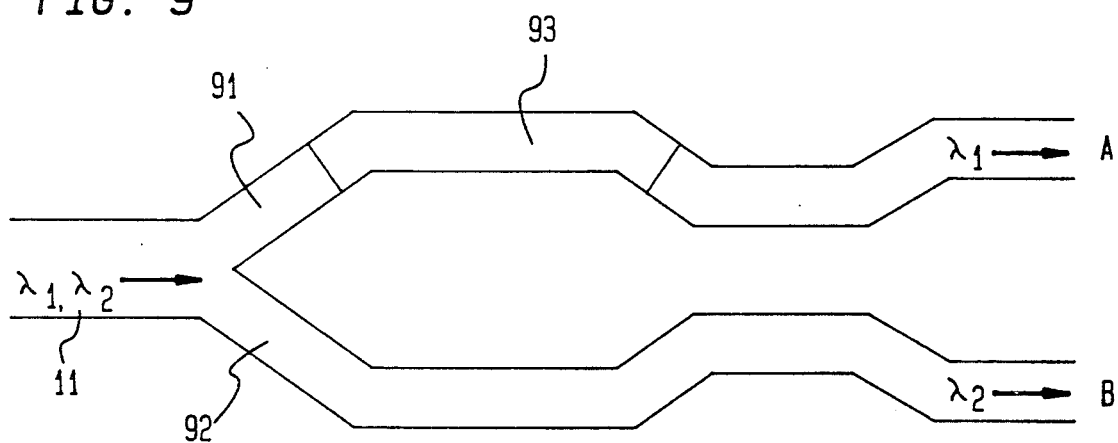
FIG. 9 is an enlarged schematic plan view of a narrow-band Mach-Zehnder interference filter, representing a preferred further use of the invention.
Figure 10:
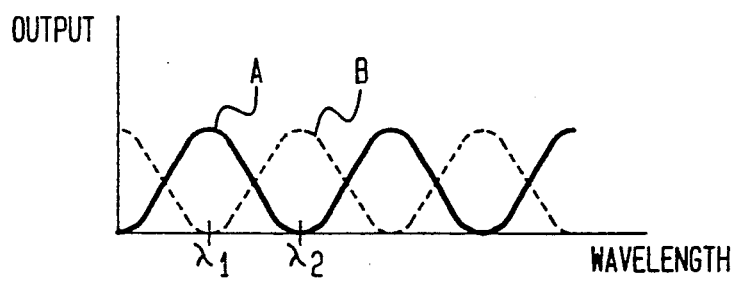
FIG. 10 is a graph of output intensity as a function of wavelength, at terminals of the device of FIG. 9.

FIG. 9 shows a waveguide 11 splitting into branches 91 and 92 which, after a distance of optical separation, are in 3-dB coupling relationship before separating again into ports A and B. Waveguide 91 is provided with a very thin grafted and patterned delay film 93 of a high-index material, serving to slow down the wave while maintaining single-mode propagation, and serving to cause a phase shift such that, upon recombination of waves, the intensity of light of different wavelengths lambda[1] and lambda[2] exiting at ports A and B is as shown in FIG. 10. For example, for light at a wavelength of 1.3 micrometer, gallium arsenide is suitable as a delay film material.

Figure 11:
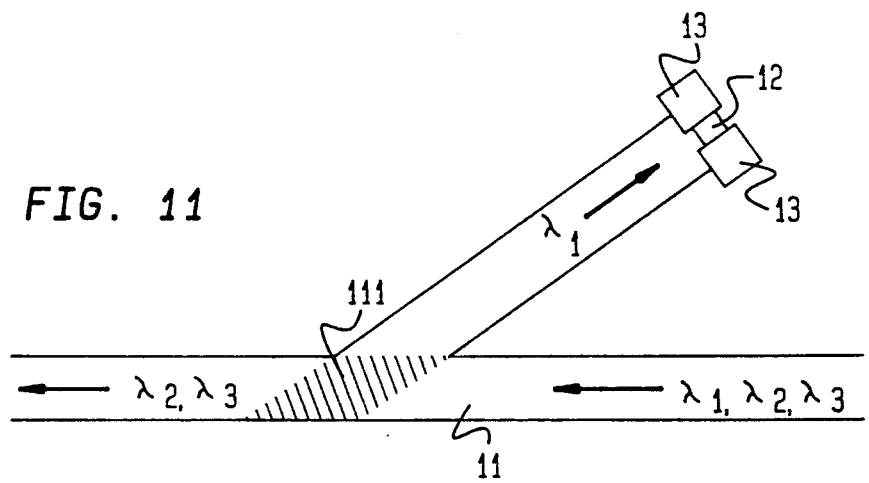
FIG. 11 is an enlarged schematic plan view of a Y-junction wavelength demultiplexer, representing a preferred further use of the invention.

FIG. 11 shows wavelength-selective reflector grating 111 on Y-shaped waveguide 11 in a highly efficient demultiplexer arrangement. The grating is made by grafting a film of transparent, high-index material on the waveguide at the point of bifurcation, and etching of a lithographically defined grating pattern into the film. For example, for light at a wavelength of 1.5 micrometer, gallium arsenide is suitable as a grating material. The detector may be as described in FIG. 1 or FIG. 7, for example. Here, use of a high-index grafted film is preferred as such a film can be made highly uniform, with well-controlled composition and thickness—resulting in strong, well-controlled wavelength-selective optical interaction. By cascading a structure as depicted, using different grating periods downstream, further wavelengths (lambda[2], etc.) can be demultiplexed. In such and other cases it will be advantageous to include grafted detector films made of diffent materials, selected for response at different wavelengths.

Figure 12:
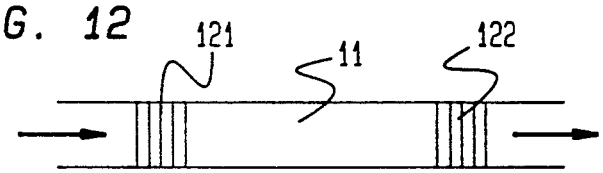
FIG. 12 is an enlarged schematic plan view of a grating resonator filter, representing a preferred further use of the invention.

FIG. 12 shows waveguide 11 with gratings 121 and 122, made by pattern-etching a high-index, transparent grafted layer. In this fashion, relatively short gratings are sufficient to make high-strength reflectors, and a relatively compact resonator structure is obtained even when grating separation is such as to provide for several transmission peaks.

Figure 13:
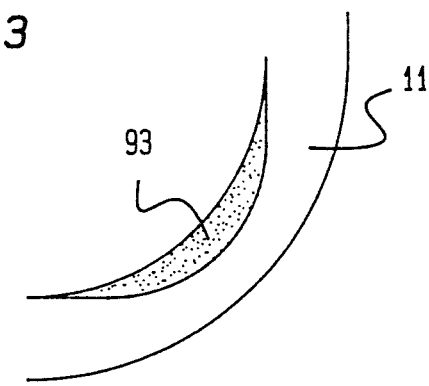
FIG. 13 is an enlarged schematic plan view of a curved waveguide in accordance with a preferred further embodiment of the invention.

FIG. 13 shows a curved waveguide 11 and, covering a portion of its inner boundary, a grafted and patterned delay film 93 whose presence results in reduced energy loss by radiation when light travels in the waveguide.

Figure 14:
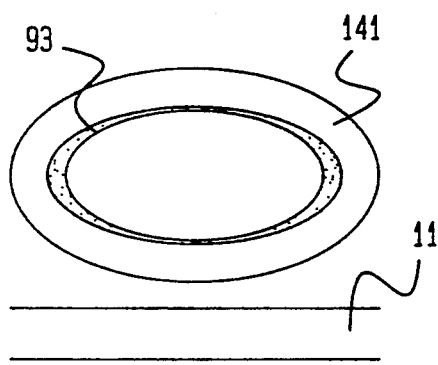
FIG. 14 is an enlarged schematic plan view of a ring resonator, representing a preferred further use of the invention.

FIG. 14 shows delay film 93 as incorporated to minimize loss in a ring resonator comprising a waveguide 11 in optical coupling relationship with additional, closed-loop waveguide 141. Minimized loss by radiation allows for compact resonator design, with widely spaced resonant wavelengths.

As described, preferred devices of the invention comprise a crystal film made by epitaxial layer growth methods, e.g., molecular-beam epitaxy, metal-organic chemical vapor deposition, or liquid-phase epitaxy. It is understood that use of such methods may yield imperfect crystal layers, possibly including imperfections, e.g., lattice defects and lattice dislocations—without undue interference with device use. Devices of the invention are distinguished by performance uncompromised by suboptimal choice of materials, as crystallographic compatibility of materials is not an issue in device design. And economies are realized in fabrication, as preferred processing in accordance with the invention does not involve heteroepitaxial growth.

We claim:

1. An integrated device comprising a semiconductor crystal film on a substrate which comprises a substantially planar surface,
    said substrate comprising an optical waveguide, and
    said crystal film being grafted onto a subpart of said surface in optical coupling relationship with said waveguide.

2. The device of claim 1, wherein said crystal film is lithographically patterned, subsequent to grafting, into a plurality of insular segments.

3. The device of claim 1, comprising a plurality of grafted semiconductor crystal film segments made of different semiconductor materials.

4. The device of claim 1 wherein said crystal film comprises a layered structure.

5. The device of claim 4 wherein said layered structure comprises p-doped, intrinsically doped, and n-doped semiconductor layers forming a p-i-n detector.

6. The device of claim 1, further comprising a transparent material on said crystal film and said waveguide.

7. The device of claim 1, further comprising layer means between said waveguide and said crystal film, for influencing the optical interaction between said waveguide and said crystal film.

8. The device of claim 7 wherein said layer means comprises a plurality of sublayers forming a heterostructure.

9. The device of claim 1, further comprising an electrical contact to said crystal film.

10. The device of claim 1 wherein said crystal film is patterned to form a grating.

11. The device of claim 1 wherein said crystal film forms delay-layer means grafted adjacent to a curved portion of said waveguide, for locally retarding light traveling in said waveguide, thereby reducing energy loss of said light.

12. An integrated device comprising a semiconductor crystal film on a substrate which comprises a substantially planar surface, said substrate comprising an optical waveguide, said crystal film being on a subpart of said surface and in optical coupling relationship with said waveguide, and at an interface between said crystal film and said subpart, said crystal film being crystallographically unlike said substrate.

13. The device of claim 12 wherein said substrate comprises glass.

14. The device of claim 12 wherein said substrate comprises a material having an optical property which can be influenced by electrical means.

15. The device of claim 12 wherein said substrate is a semiconductor substrate.

16. An integrated device comprising a semiconductor crystal film grafted to a substrate, and a layer for additionally fastening at least a portion of an edge of said crystal film to said substrate.

17. An integrated device comprising a plurality of semiconductor crystal-film segments on an insulating substrate, said semiconductor crystal-film segments being grafted as islands onto said substrate, and at least two of said semiconductor crystal-film segments bearing respective integrated-circuit structures which are isolated from each other with respect to unintentional electrical influence.

18. The device of claim 16 wherein said layer extends across said edge, being disposed in part on said crystal film and in part on said substrate.

19. The device of claim 18 wherein said layer consists essentially of an electrical contact material.

20. The device of claim 17, wherein said integrated-circuit structures are isolated from each other with respect to sidegating.

21. The device of claim 17 wherein said substrate comprises an insulating layer.

22. The device of claim 17 wherein electrical isolation between said at least two segments is improved by a factor of at least 1000 as compared with a structure comprising corresponding semiconductor layers on the substrate on which they were grown.

* * * * *